United States Patent [19]

Negle

[11] Patent Number: 5,028,863
[45] Date of Patent: Jul. 2, 1991

[54] HIGH VOLTAGE MEASURING DEVICE

[75] Inventor: Hans Negle, Nahe, Fed. Rep. of Germany

[73] Assignee: U.S. Philips Corporation, New York, N.Y.

[21] Appl. No.: 468,558

[22] Filed: Jan. 23, 1990

[30] Foreign Application Priority Data

Jan. 26, 1989 [DE] Fed. Rep. of Germany ....... 3902263

[51] Int. Cl.$^5$ .......................................... G01R 31/02
[52] U.S. Cl. ..................................... 324/72; 324/627; 324/158 P
[58] Field of Search ............... 324/72, 72.5, 457, 539, 324/514, 627, 158 F, 158 P, 458

[56] References Cited

U.S. PATENT DOCUMENTS

| 2,378,928 | 6/1945 | Johnson, Jr. et al. ......... 324/627 X |
| 2,747,160 | 5/1956 | Bird .................................... 324/627 |
| 4,277,746 | 7/1981 | Abe et al. ............................. 324/72 |
| 4,814,713 | 3/1989 | Van Brundt et al. ............... 324/539 |

Primary Examiner—Kenneth Wieder
Assistant Examiner—Robert W. Mueller
Attorney, Agent, or Firm—Bernard Franzblau

[57] ABSTRACT

A high-voltage measuring device includes a grounded, cylindrical outer electrode (1) and an inner coaxial electrode (2) which has an at least approximately cylindrical shape and carries a high-voltage potential. A non-flat high-voltage resistor (3) which is arranged coaxially with respect to the inner electrode and is connected thereto. This resistor extends at least as far as the vicinity of the outer electrode. The response bandwidth and the loadability of the device substantially improved in that the high-voltage resistor is a cone shape envelope of uniform thickness such that the potential variation in response to current flow through the resistor corresponds to the electrostatic potential variation at least at the area of the inner electrode.

20 Claims, 2 Drawing Sheets

HIGH VOLTAGE MEASURING DEVICE

BACKGROUND OF THE INVENTION

This invention relates to a high-voltage measuring device, comprising a grounded, cylindrical outer electrode, an at least approximately cylindrical inner electrode which is arranged so as to be coaxial therewith and which carries a high-voltage potential, and a non-flat high-voltage resistor which is concentrically arranged with respect to the inner electrode and is connected thereto, which high-voltage resistor extends at least as far as the vicinity of the outer electrode.

A device of this kind is known from DE-AS 28 33 036. The high-voltage resistor thereof is formed by a resistance layer on an insulating body which serves as a supporting insulator for the inner electrode. At its ends which face the inner electrode and the outer electrode, the insulating body comprises parts whose surface extends perpendicularly with respect to the inner electrode and which are interconnected via a portion which is tapered in a funnel-like fashion towards the inner electrode.

X-ray generators require high-voltage measuring devices whose response curve is as independent of the frequency as possible. The known device only conditionally satisfies this requirement.

SUMMARY OF THE INVENTION

It is the an object of the invention to construct a device of the kind set forth so that it has a large response bandwidth.

This object is achieved in accordance with the invention in that the high-voltage resistor is shaped as an envelope of a cone of uniform thickness so that the potential variation upon passage of current through the high-voltage resistor corresponds to the electrostatic potential variation at least at the area of the inner electrode.

The invention is based on the idea that in a coaxial electrode system comprising an inner electrode carrying a high-voltage potential electrostatic potential decreases as a function of the logarithm of the distance between the inner electrode and the outer electrode. On the other hand, a current flow through a resistance layer in the form of an envelope of cone of a uniform thickness causes a voltage drop across the resistor which changes as a function of the distance from the inner electrode in the same way as the electrostatic potential. As a result of this smooth matching of the electrostatic potential field and the potential field produced by the current flow, no currents need flow from the high-voltage resistor in order to charge the parasitic capacitances. Thus, the operation of the high-voltage resistor is frequency-independent even for the highest frequencies.

The high-voltage resistor can be realized in various ways. In a first embodiment in accordance with the invention, the high-voltage resistor is formed by a self-supporting resistor body in the form of a hollow cone. In a further embodiment in accordance with the invention, the high-voltage resistor is formed by a resistance layer of uniform thickness on an insulating carrier in the form of a hollow cone. The latter embodiment is more complex, but also more accurate.

The space between the two electrodes is filled with an insulating medium (for example, vacuum, transformer oil, $SF_6$ or plastics) whose dielectric constant deviates from that of the high-voltage resistor and possibly that of the carrier on which the resistance layer is provided. Consequently, the variation of the electrostatic potential is not the same as that in the case of a uniform dielectric between the inner electrode and the outer electrode, so that deviations can occur between the electrostatic potential variation and the potential variation produced by the flow of current through the high-voltage resistor. These deviations would cause displacement currents and hence a greater frequency dependency. Therefore, in a further embodiment in accordance with the invention, the deviations of the electrostatic potential variation which are due to the different dielectric constants are compensated for by means of a continuous variation of the diameter of the inner electrode which commences at the area of connection to the high-voltage resistor. When the dielectric constant of the insulating medium is higher than that of the resistor and possibly that of the carrier body, the diameter of the inner electrode must increase, commencing at the area of connection; otherwise, it should decrease.

As in the known device, the high-voltage resistor may form a part of a measuring voltage divider. However, it can alternatively be used exclusively for measurement when, for example, the current flowing therethrough is measured. When it is used as a part of a measuring voltage divider, the improvement of the high-frequency behaviour achieved in accordance with the invention cannot be fully utilized when the measuring resistor construction is not optimum. An improvement in this respect is achieved in that the edge of the high-voltage resistor which is remote from the inner electrode is connected, via a funnel-shaped contact member, to a resistance layer which forms the measuring resistor on the inner surface of a hollow cylinder, the connection area between this layer and the contact member being connected to the inner conductor, the end of the measuring resistor which is remote therefrom being connected to the outer conductor of a coaxial cable. The tapping of the voltage divider is thus shifted to the area within the hollow-cylindrical measuring resistor in which no magnetic fields are present.

BRIEF DESCRIPTION OF THE DRAWINGS

The invention will be described in detail hereinafter with reference to the drawings, in which.

DESCRIPTION OF THE PREFERRED EMBODIMENTS

Figure 1:
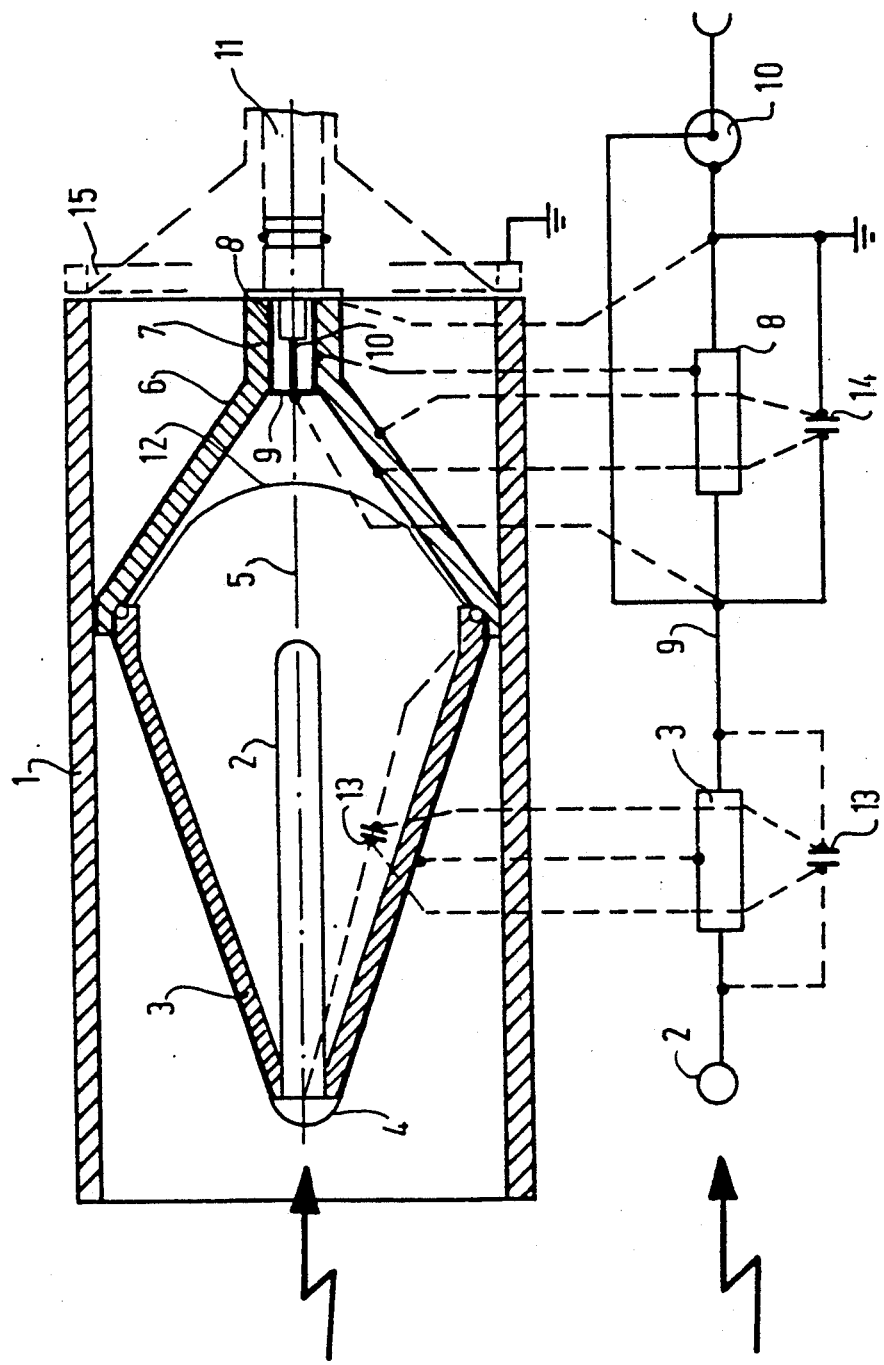
FIG. 1 shows an embodiment in accordance with the invention in which measurement is performed by way of a coaxial cable which is concentrically arranged with respect to the outer electrode.

A grounded tubular or hollow-cylindrical outer electrode 1 encloses an at least substantially cylindrical inner electrode 2 which is arranged so as to be concentric therewith and which carries a high-voltage potential during operation. When the inner diameter of the outer electrode amounts to approximately 2.7 times the diameter of the inner electrode, the lowest possible electric field strength is obtained (when the dimensions of the outer electrode and the high voltage are given).

A self-supporting resistor body having a constant wall thickness and a uniform specific resistance is connected to the inner electrode so as to be coaxially arranged with respect thereto. This resistor body is shaped as a hollow cone, i.e. its surfaces of envelope extend rectilinearly in a cross-section containing the symmetry axis of the device. The length of the part of the inner electrode 2 which projects into the resistor body 3 is approximately equal to that of the resistor body. The area of connection of the inner electrode 2 to the resistor body 3 is shielded by a lens-shaped metal cap 4 whose outer surface smoothly continues into the outer surface of the resistor body 3.

Assuming that the length of the coaxial device 1, 2 is long in comparison with its diameter and ignoring the carrier 3, between the two electrodes there is formed an electrostatic field whose potential varies logarithmically as a function of the distance from the symmetry axis 5. The same potential variation is also obtained on the surface of a resistor body of uniform thickness, which is arranged on one of the coaxial surfaces of envelope interconnecting the two electrodes, when a current flows through this layer from the inner electrode to the outer electrode. In this construction of the high-voltage resistor, no charging currents flow via the resistor, so that the impedance of the high-voltage resistor is highly independent of the frequency. This also holds for the embodiment shown in the drawing in which the edge of the inner resistor which is remote from the inner electrode does not quite reach the outer electrode 1. However, said edge is connected, as will be explained hereinafter, to the potential of the outer electrode (ground) via a resistor which is electrically small in comparison with the high-voltage resistor.

When the resistor body 3 is to be self-supporting, the walls must usually have a given minimum thickness. However, considering that the resistor body is comparatively short and that the high-voltage resistor must be very large (for example, 100 Mohms or more), it appears that the resistor body must be made of a material having an extremely high specific resistance. For this purpose there are available ceramic compounds which are possibly slightly doped. The advantage that a self-supporting resistor body of at least substantially uniform thickness can be comparative easily constructed by means of such a material is opposed by the drawback that such a material exhibits a strong temperature dependency.

There also exist resistance materials which have a lower temperature dependency, but their specific resistance is substantially lower. In order to realize the same resistance, therefore, the thickness of the resistance layer must be substantially smaller so that high-voltage resistors comprising such a resistance layer cannot be constructed to be self-supporting. Consequently, the resistance layer must be provided on a hollow cone-shaped supporting body, for example, one made of an insulating ceramic material. Local deviations of only a few $\mu m$ from the prescribed layer thickness may then give rise to field distortions which in turn cause parasitic currents and hence a frequency-dependent response curve. Consequently, the layer cannot be deposited by means of a simple silk screening process but must be provided by CVD, sputtering or other expensive methods, or the uniformity of the layer must be achieved by way of a complex finishing operation. The lower temperature dependency is thus achieved at the expense of higher manufacturing costs.

If the resistance layer of uniform thickness were not provided on a hollow cone, but on another rotationally symmetrical body, on the surface of the resistor the same potential variation could be achieved as a function of the distance from the inner electrode if the thickness and/or the specific resistance of the resistance layer were varied in dependence on the radius. However, because it is very difficult to manufacture such a layer, the conical shape with a homogeneous resistance layer of uniform thickness is to be preferred.

When the supporting body is comparatively thick in comparison with the resistance layer and is made of a material whose dielectric constant deviates substantially from the dielectric constant of the insulating medium (vacuum, sulphurhexafluoride, transformer oil or pastics), the electrostatic potential no longer varies as a function of the logarithm of the distance from the inner electrode. The electrostatic potential variation and the potential variation imposed by the passage of current through the high-voltage resistor thus no longer match completely in this case.

Improved matching can be achieved by selecting the radius r of the inner electrode in dependence on the distances between the inner surface of the resistor body and the symmetry axis 5 in accordance with the equation $$r = r_0 \cdot (s/(s-d) \cos \beta)^x \quad (1)$$

Therein, d is the thickness of the resistor body and $\beta$ is the angle at which a surface line of this body intersects the symmetry axis 5. $r_0$ is half the diameter of the cap 4 at the area adjacent the resistor body 3, and the exponent x is calculated in accordance with the relation $$x = E_1/E_2 - 1 \quad (2)$$

Therein, $E_1$ is the dielectric constant of the insulating medium between the two electrodes. $E_2$ is the dielectric constant of the resistor body.

The equations 1 and 2 demonstrate that the radius of the inner electrode must increase, commencing from the area of connection of the high-voltage resistor to the inner electrode, when $E_2$ is larger than $E_1$. This increase amounts to percents of the inner diameter. Instead, however, the inner diameter of the outer electrode can also be changed in order to obtain the desired potential matching. In that case, at least its inner surface is only approximately cylindrical. This variation opposes that calculated in accordance with the equations 1 and 2.

The open end of the resistor body (assuming that the high-voltage resistor is formed by a self-supporting hollow cone made of a resistance material) is mechanically connected to the corresponding end of a further hollow conical carrier 6. The latter carrier is thus tapered, commencing from the connection area, until it changes over into a hollow cylinder 7 of constant diameter. The carrier body 6 may be made of a ceramic material and its outer surface is metallized, the metallization being grounded via the outer electrode 1. The inner surface of the carrier body 6 is also metallized and serves as a conductive connection between the high-voltage resistor formed by the resistor body 3 and a measuring resistor which is formed by a resistance layer 8 on the inner side of the hollow cylindrical part 7. It will be evident that the measuring resistor 8 can also be formed by a hollow conical resistor body. The measuring resistor 8 is grounded at its edge which is remote from the inner electrode 2, its edge which faces the inner electrode being terminated by a conductive, circular disc 9. The centre of this disc is connected to the inner conductor 10 of a coaxial cable whose outer conductor is connected to ground.

The high-voltage resistor 3 and the measuring resistor 8 together form a measuring voltage divider which divides the high voltage by a defined ratio, for example, 1:10,000. The voltage extracted from the tapping (disc 9) can be used for measuring or control purposes. As a result of this construction, the inner conductor 10 of the coaxial cable 11 is shielded to a high degree from interference signals, notably when the open end of the outer electrode 1 is shielded by the grounded metal shield 15 denoted by broken lines. When this metal shield is connected to a second shielding of a coaxial cable, a double-shielded construction is obtained. The measuring current produced in the measuring resistor by the high voltage in the measuring voltage divider then flows axially symmetrically through the resistor, resulting in a particularly low-induction measuring construction. Using a grounded protective electrode 12 which is shaped as a spherical cap and which is connected to the end portion of the carrier body 3 prevents flash-overs between the inner electrode and the disc 9.

As is denoted by broken lines in the drawings, longitudinal capacitances between the inner electrode and the measuring voltage divider tapping cannot be completely avoided. The resultant capacitance 13 is parallel to the high-voltage resistor 3. The capacitance could cause a variation of the response curve at high frequencies. This variation can be compensated for, if desired, by means of a capacitance 14 which acts parallel to the measuring resistor 8. In order to achieve exact compensation, this capacitance should exceed the stray capacitance 13 by an amount which is equal to the amount whereby high-voltage resistor 3 exceeds the measuring resistor 8. This comparatively high capacitance can be achieved by using a ceramic material having a comparatively high dielectric constant (for example, 100 or 1000) as the material for the carrier body 6, 7. As appears from the equivalent diagram shown in FIG. 1, an RC voltage divider is then obtained which is frequency-independent when the time constants of the two RC members 3, 13 and 8, 14 are equal.

The measuring voltage is reduced to, for example, 1/10,000 of the high voltage by the measuring resistor. The electrostatic potential at the outer edge of the high-voltage resistor, however, may be substantially higher should the diameter of the resistor at this area not correspond to the inner diameter of the outer electrode within a few millimeters. This deviation between the electrostatic potential variation and the potential variation caused by the current flow, however, neither becomes manifest in the resistor area around the inner electrode, which is important for the high-voltage strength, nor is the frequency response significantly influenced thereby, because no substantial voltage variation occurs at this area. The deviation can be completely avoided when the outer electrode comprises an annular portion of large diameter at the area of the outer edge of the carrier body, the edge projecting into said annular portion. Herein, the interpretation of the term "cylindrical outer electrode" must, therefore, be so broad that it also includes such a shape.

Figure 2:
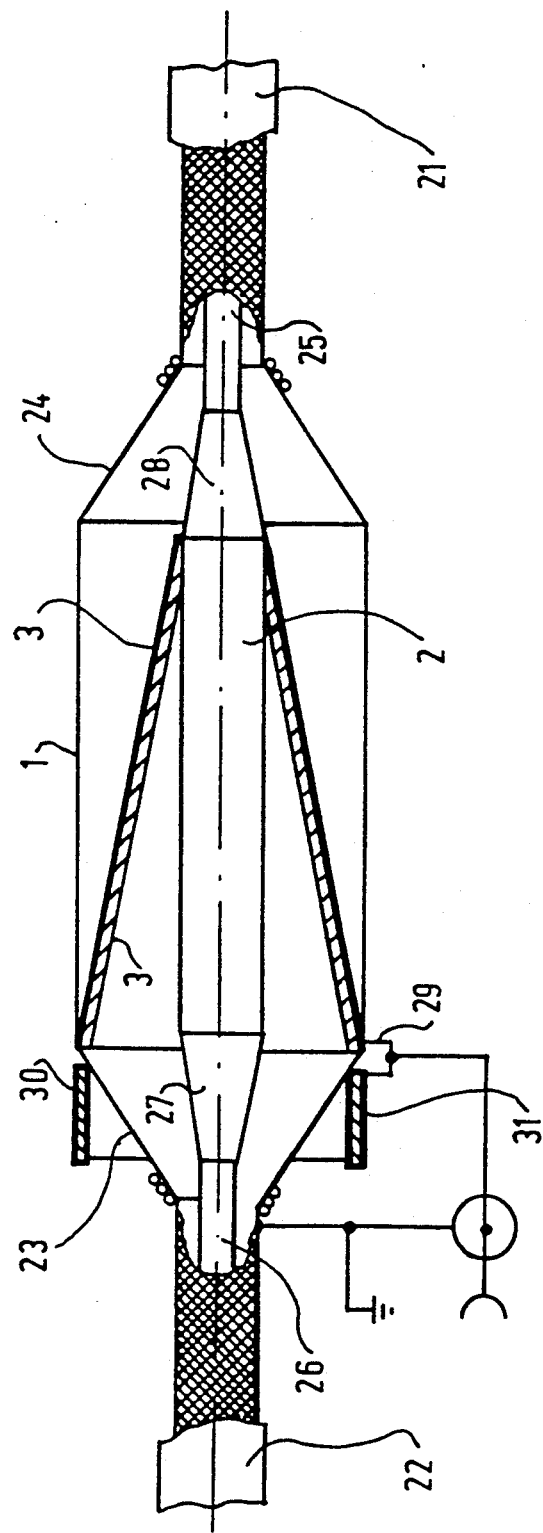
FIG. 2 shows an embodiment in which the device is inserted in a high-voltage cable.

The high voltage can be applied to the inner electrode via a single high-voltage conductor when the device is arranged, for example, inside a generator filled with an insulating medium. However, it can also be applied via a high-voltage cable, for example, as shown in FIG. 2. When it is ensured that the characteristic impedances of the coaxial cable 11 and the high-voltage cable are matched, reflections and associated excess voltages can be avoided in the case of travelling waves.

In the embodiment shown in FIG. 2, the device in accordance with the invention is arranged between two high-voltage cables. The outer conductors of the two high-voltage cables 21 and 22 are connected to a respective grounded hollow conical projection 23, 24, respectively, and the outer electrode 1 is situated between the facing hollow cones. The inner conductors 25 and 26 of the two cables are electrically interconnected via the inner electrode 2 and comprise conically widening intermediate pieces 27 and 28 so that the characteristic impedance in the transitional area is not stepped. The outer edge of the high-voltage resistor 3, being electrically insulated from the outer electrode 1 by way of an insulating foil (not shown), is connected, via a suitable passage 29, to a measuring resistor, which is formed by a resistance layer 31 provided on the carrier body 30. The carrier body 30 encloses the conical projection 23 and is provided on its rear side with a metallization which is conductively connected to the projection 23 and which contacts the edge of the measuring 30, 31 which is remote from the high-voltage resistor 3.

In the embodiments shown in FIGS. 1 and 2, the measuring resistor can be dispensed with when the current across the high-voltage resistor is measured by means of a suitable measuring device. The high voltage can be determined from this measuring value and the known value of the high-voltage resistor. The edge of the high-voltage resistor may then even contact the outer electrode (conductive contact).

I claim:

1. A high-voltage measuring device, comprising a grounded, at least approximately cylindrical outer electrode, an at least approximately cylindrical inner electrode arranged coaxial therewith and which carries a high-voltage potential, and a non-flat high-voltage resistor which is concentrically arranged with respect to the inner electrode and is connected thereto, wherein the high-voltage resistor extends at least as far as the vicinity of the outer electrode, characterized in that the high-voltage resistor is shaped as a cone of uniform thickness such that the potential variation upon passage of a current through the high-voltage resistor corresponds to an electrostatic potential variation at least at the area of the inner electrode.

2. A device as claimed in claim 1, wherein the high-voltage resistor comprises a hollow conical, self-supporting resistor body.

3. A device as claimed in claim 2 wherein the high-voltage resistor forms, in conjunction with a measuring resistor, a measuring voltage divider which interconnects the inner and outer electrodes.

4. A device as claimed in claim 1, wherein the high-voltage resistor comprises a resistance layer of uniform thickness provided on a hollow, conical insulating carrier.

5. A device as claimed in claim 4 wherein the dielectric constant of the high-voltage resistor and of the carrier deviates from the dielectric constant of an insulating medium located between the inner electrode and the outer electrode, characterized in that the deviations of the electrostatic potential variation which are due to the different dielectric constants are compensated for by means of a continuous variation of the diameter of the inner electrode commencing at the area of connection to the high-voltage resistor.

6. A device as claimed in claim 4 wherein; the high-voltage resistor forms, in conjunction with a measuring resistor, a measuring voltage divider which interconnects the inner and outer electrodes, and at least an end of the high voltage resistor closest to at least one of the inner electrode and the outer electrode extends approximately parallel to an axis of symmetry of the inner electrode and the outer electrode.

7. A device as claimed in claim 1 wherein the high-voltage resistor forms, in conjunction with a measuring resistor located within the outer electrode, a measuring voltage divider which interconnects the inner and outer electrodes.

8. A device as claimed in claim 7 wherein an edge of the high-voltage resistor which is remote from the inner electrode is connected, via a funnel-shaped contact member, to the measuring resistor which comprises a resistance layer on the inner surface of a hollow cylinder, an area of connection between said layer and the contact member being connected to an inner conductor of a coaxial cable, an end of the measuring resistor which is remote therefrom being connected to an outer conductor of the coaxial cable.

9. A device as claimed in claim 7 wherein opposite ends of the inner electrode are connected to a high-voltage cable.

10. A device as claimed in claim 9, wherein an edge of the high-voltage resistor which is remote from the inner electrode is connected to a coaxial measuring resistor whose radius is larger than the outer radius of the high-voltage cable.

11. A device as claimed in claim 8 wherein the high-voltage resistor and the measuring resistor are interconnected by means of a conductive funnel which is tapered in the direction of the measuring resistor.

12. A device as claimed in claim 8 wherein the high voltage is applied to the inner electrode via a high-voltage cable, the high-voltage cable and the coaxial cable having at least approximately the same characteristic impedance.

13. A device as claimed in claim 1 wherein opposite ends of the inner electrode are connected to a high-voltage cable.

14. A device as claimed in claim 13, wherein an edge of the high-voltage resistor which is remote from the inner electrode is connected to a coaxial measuring resistor whose radius is larger than the outer radius of the high-voltage cable.

15. A device as claimed in claim 14 wherein the inner conductor and the outer conductor of the high-voltage cable are adapted to the inner electrode and the outer electrode via conical intermediate pieces such that no transient occurs in the characteristic impedance.

16. A device as claimed in claim 13 wherein the inner conductor and the outer conductor of the high-voltage cable are adapted to the inner electrode and the outer electrode via conical intermediate pieces such that no transient occurs in the characteristic impedance.

17. A device as claimed in claim 1 wherein the dielectric constant of the high-voltage resistor deviates from the dielectric constant of an insulating medium located between the inner electrode and the outer electrode, characterized in that deviations of the electrostatic potential variation which are due to the different dielectric constants are compensated for by means of a continuous variation of the diameter of the inner electrode commencing at the area of connection to the high-voltage resistor.

18. A device as claimed in claim 17 wherein the high-voltage resistor forms, in conjunction with a measuring resistor, a measuring voltage divider which interconnects the inner and outer electrodes.

19. A device as claimed in claim 18 wherein an edge of the high-voltage resistor which is remote from the inner electrode is connected, via a funnel-shaped contact member, to the measuring resistor which comprises a resistance layer on the inner surface of a hollow cylinder, an area of connection between said layer and the contact member being connected to an inner conductor of a coaxial cable, an end of the measuring resistor which is remote therefrom being connected to an outer conductor of the coaxial cable.

20. A high voltage measuring device comprising:
an at least approximately cylindrical grounded outer electrode,
an at least approximately cylindrical inner electrode coaxially arranged within the outer electrode,
means for applying a high voltage to the inner electrode whereby an electrostatic voltage variation is developed in said device at least in the area of the inner electrode, and
a high voltage resistor between the inner and outer electrode and concentrically arranged relative to the inner electrode and electrically connected thereto, wherein said high voltage resistor is shaped as a cone of uniform thickness which extends between the inner electrode and the vicinity of the outer electrode and with at least one end of said resistor extending in the general direction of the inner electrode such that a current flow through said high voltage resistor produces a voltage drop across the resistor having a variation that corresponds to said electrostatic voltage variation, thereby to inhibit a current flow from the high voltage resistor to a parasitic capacitance within said device.

* * * * *